(12) United States Patent (10) Patent No.: US 7,683,798 B2
Rostron (45) Date of Patent: Mar. 23, 2010

(54) CURRENT MONITORING DEVICE FOR HIGH VOLTAGE ELECTRIC POWER LINES

(75) Inventor: Joseph R. Rostron, McDonough, GA (US)

(73) Assignee: SSI Power, LLC, Hampton, GA (US)

( * ) Notice: Subject to any disclaimer, the term of this patent is extended or adjusted under 35 U.S.C. 154(b) by 461 days.

(21) Appl. No.: 11/774,955

(22) Filed: Jul. 9, 2007

(65) Prior Publication Data

US 2008/0012720 A1 Jan. 17, 2008

Related U.S. Application Data

(60) Provisional application No. 60/819,516, filed on Jul. 7, 2006.

(51) Int. Cl.
*G08B 21/00* (2006.01)

(52) U.S. Cl. .................. 340/664; 340/648; 340/650; 340/651; 340/658; 340/310.11; 324/117 H; 324/117 R; 324/628; 702/58; 702/60; 702/65

(58) Field of Classification Search ................ 340/664, 340/648, 650, 651, 658, 310.11; 324/628, 324/117 H, 117 R; 702/58, 60, 65
See application file for complete search history.

(56) References Cited

U.S. PATENT DOCUMENTS 4,949,001 A 8/1990 Campbell

| 5,151,649 | A |   | 9/1992  | Heroux |         |
|-----------|---|---|---------|--------|---------|
| 5,181,026 | A |   | 1/1993  | Granville | |
| 5,250,894 | A | * | 10/1993 | Bridges et al. | 324/117 H |
| 5,325,315 | A |   | 6/1994  | Engel et al. | |
| 5,568,131 | A | * | 10/1996 | Sakai et al. | 340/648 |
| 5,905,354 | A | * | 5/1999  | Futsuhara et al. | 318/700 |

FOREIGN PATENT DOCUMENTS

GB 1398842 6/1975
WO WO/2006/007131 1/2006

* cited by examiner

*Primary Examiner*—Tai T Nguyen
(74) *Attorney, Agent, or Firm*—Michael J. Mehrman; Mehrman Law Office, PC

(57) ABSTRACT

A current monitoring device (CMD) with a set of electromagnetic field sensors located within one or more grounded housings positioned within the combined electromagnetic fields generated by one or more electric power lines. The CMD includes electronics, typically located within the grounded housings, defining impedance networks that combine the measurements received from the field sensors to create output signal indicative of electric current values for the phase conductors. The housings can be conveniently attached and to transmission line towers, distribution line poles, and high voltage power line supports in transmission and distribution substations. The CMD controls response equipment, such as a circuit interrupter that responds to current disturbances detected by the CMD. The CMD may also include communication for sending the current values to a remote controller, such as a central control station, that implements a wide range of response equipment.

19 Claims, 11 Drawing Sheets

CURRENT MONITORING DEVICE FOR HIGH VOLTAGE ELECTRIC POWER LINES

REFERENCE TO RELATED APPLICATION

This application claims filing priority to U.S. Provisional Patent Application Ser. No. 60/819,516 filed Jul. 7, 2006, which his incorporated herein by reference. The application also incorporates by reference U.S. Pat. No. 7,191,074 entitled "Electric Power Monitoring And Response System" granted Mar. 13, 2007; U.S. Pat. No. 7,078,643 entitled "Capacitor Switch With Internal Retracting Impedance Contactor" granted Jul. 18, 2006; and U.S. Pat. No. 6,236,010 entitled "Circuit Interrupter Including a Penetrating Electrical Contact With Grip and Release Structure" granted May 22, 2001.

TECHNICAL FIELD

The present invention relates to the field of high voltage electric power transmission and distribution systems and, more particularly, to an electric power monitoring and response system that uses a current monitoring device with electromagnetic field sensors located within a grounded housing to determine the phase currents in an electric power line.

BACKGROUND OF THE INVENTION

At present, ring-type current transformers ("CTs") are the most prevalent technology for measuring phase currents in three-phase electric power transmission and distribution lines. While very accurate, these devices are quite expensive when applied at high voltages. This results, in large part, from the need to insulate the current sensors for high-voltage, which is quite expensive for voltages above 1,000 volts. There have been other approaches using other types of electromagnetic field sensors, such as a Hall Effect sensor, located close to each phase conductor. In multiphase applications, this technique is complicated by electromagnetic field interference from the adjacent phases, which results in inaccurate measurements. As a result, the only successful technique using this type technology has been to use a ring of electromagnetic field sensors that completely encircles the conductor to balance out the extraneous error signals from other phases. This approach also requires expensive high-voltage insulation for the electromagnetic field sensors, which makes the system economically feasible only in limited situations.

Another approach to high voltage current measurement uses fiber optic sensors that pass polarized light around each conductor. The electromagnetic field generated by the phase current rotates the polarized light in proportion to the current. While this technique reduces the difficulty of insulating the current sensor at high voltages, the sophisticated decoding technology required to turn the polarization measurement into a current measurement is quite expensive. Again, this approach is economically feasible only in limited situations, for example at the highest transmission line voltages.

Another type of power system unknown occurs because high currents and ambient air heat the electric conductors, which causes them to stretch and sag from their overhead supports. If this sag becomes too large, a voltage breakdown and resulting flash over can occur between the power line and another object, such as a tree or hill. It is therefore desirable to monitor the physical sag of the power line at critical locations during normal operating conditions. Algorithms have be used to estimate the physical sag of the power line based on the current values measured at the substation, ambient conditions, and the physical configuration of the line section of interest. But these algorithms only produce estimates of the physical sag at critical locations that can vary significantly from the actual conditions due to voltage drop and reactive power loading on the lined during high load conditions. Another approach has been to take direct distance measurement using optical systems that typically include laser distance finders and cameras. But these optical systems are very expensive, do not work well in the dark, can be adversely affected by bad weather and fouling by grime, bird droppings and the like.

U.S. Pat. No. 7,191,074 entitled "Electric Power Monitoring And Response System" describes an electric power monitoring and response system that uses remotely located electromagnetic field sensors to determine unknown power system variables, such as the phase currents, phase voltages and/or the distances from the field sensors to the phase conductors. Although this patent describes the fundamental technology, it does not address specific configurations and refinements of the electric power monitoring and response system, such as those suitable for adapting the system for installation high voltage power line support structures, such as those found in transmission and distribution substations. Accordingly, there is an ongoing need for improvements to electric power monitoring equipment specifically adapt and refined for particular applications.

SUMMARY OF THE INVENTION

The present invention meets the needs described above through an electric power monitoring and response system for phase conductors of one or more multi-phase power lines that uses electromagnetic field sensors, such as inexpensive electric wire coils, located within one or more grounded housings positioned within the combined electromagnetic fields generated by the phase conductors. The system also includes electronics, typically located within the grounded housings, defining impedance networks that combine the measurements received from the electromagnetic field sensors to create output signal indicative of electric current values for the phase conductors. The housings can be conveniently attached and electrically grounded to the type of high voltage power line support commonly found in transmission and distribution substations.

The electric power monitoring and response system may also include a local controller that computes or calibrates the electric current values for the phase conductors based on the output signals received from the electromagnetic sensors and associated electronics. A control cable from the electric power monitoring and response system is typically connected to a local circuit interrupter located on the same support structure that opens an affected circuit in response to a detected current fault. The local controller can also be connected to a local transmitter that sends control signals to a remote controller that operates remote response equipment, such as a display, a circuit interrupting device, a voltage regulator, a voltage sag supporter, a capacitor bank, communication equipment, and reporting system. Once an electric power system is configured with a substantial number of these electric power monitoring and response systems transmitting current values to a central location, sophisticated electric power monitoring and control operations can be implemented to improve the reliability and efficiency of the electric power service.

Housing a set of electromagnetic field sensors appropriate for a single power line elongated conductive tubes or wands creates a modular current monitoring device configured to be physically attached and electrically grounded to a high-voltage power line support. The current monitoring device can also be connected to a local controller, such as a circuit interrupter for the associated power line. Because the electric power monitoring equipment is electrically grounded, it does not create a potential fault for the electric power line and is electrically isolated from electric system disturbances, such as current faults, voltage spikes, lightening strikes, and the like.

Generally described, the invention may be implemented as an electric current monitoring and response system for high voltage electric power lines or an electric power system including one or more electric current monitoring and response systems. The electric current monitoring and response system includes one or more electrically conductive, non-electromagnetic housings configured to be electrically grounded in a position within electromagnetic fields created by phase conductors of one or more multi-phase, high-voltage electric power lines. Each housing is preferably a modular unit configured to be connected to, physically supported by, and electrically grounded to a support structure that supports high voltage insulators that support the phase conductors, such as a support structure commonly located within a transmission or distribution substation. Each housing may also include an elongated slot configured to impart a desired frequency response to the electromagnetic field sensors.

A set of electromagnetic field sensors laterally distributed within the housings are configured to simultaneously measure the combined electromagnetic fields generated by the phase conductors. For each electric current value to be computed, the system also includes electronics defining an impedance network, typically located within a grounded housing, that combines the measurements received from the electromagnetic field sensors to create an output signal indicative of the electric current value for an associated phase conductor. The electromagnetic field sensors may be formed from a continuous wire in which the coil lengths and coil winding directions differ among the coils. In addition, the electromagnetic field sensors and electronics defining the impedance networks may consist of passive components that do not require an electric power source other than the electromagnetic fields generated by the phase conductors.

A local controller may compute or calibrate the electric currents values indicative of the electric currents flowing in the phase conductors based on the output signals and to produce control signals based on the electric current values. The system also includes some type of response equipment that implements a response action based on the control signals. For example, the response equipment may include local response equipment electrically connected to the controller, such as a circuit interrupter, and the controller may be configured to trigger operation of the circuit interrupter in response to determining that an electric fault has occurred involving one of the monitored the phase conductor based on an associated electric current value. In addition, the system may include a local transmitter, a remote controller, and remote response equipment such as a display, a circuit interrupting device, a voltage regulator, a voltage sag supporter, a capacitor bank, communication equipment, and reporting system.

The invention may also be practiced as a method for obtaining electric current values for a multi-phase, high-voltage electric power line. An electric current monitoring system is installed within the electromagnetic fields created by phase conductors of one or more multi-phase, high-voltage electric power lines. The electric current monitoring system includes a set of electromagnetic field sensors laterally distributed within one or more electrically conductive, non-electromagnetic, electrically grounded housings and, for each electric current value, electronics defining an impedance network operative for combining the measurements received from the electromagnetic field sensors to create an output signal indicative of the associated electric current value. Known electric currents are then applied to the phase conductors and output values representing computed electric current values are obtained from the electric current monitoring system. Parameters of the electric current monitoring system are then calibrated to conform the computed electric current values to the known electric currents. The calibration equipment is then removed, and the calibrated electric current monitoring system is used to compute electric current values for unknown electric current values.

The specific techniques and structures for implementing particular embodiments of the electric power monitoring and response system, and thereby accomplishing the advantages described above, will become apparent from the following detailed description of the embodiments and the appended drawings and claims.

DETAILED DESCRIPTION OF THE EMBODIMENTS

Figure 1:
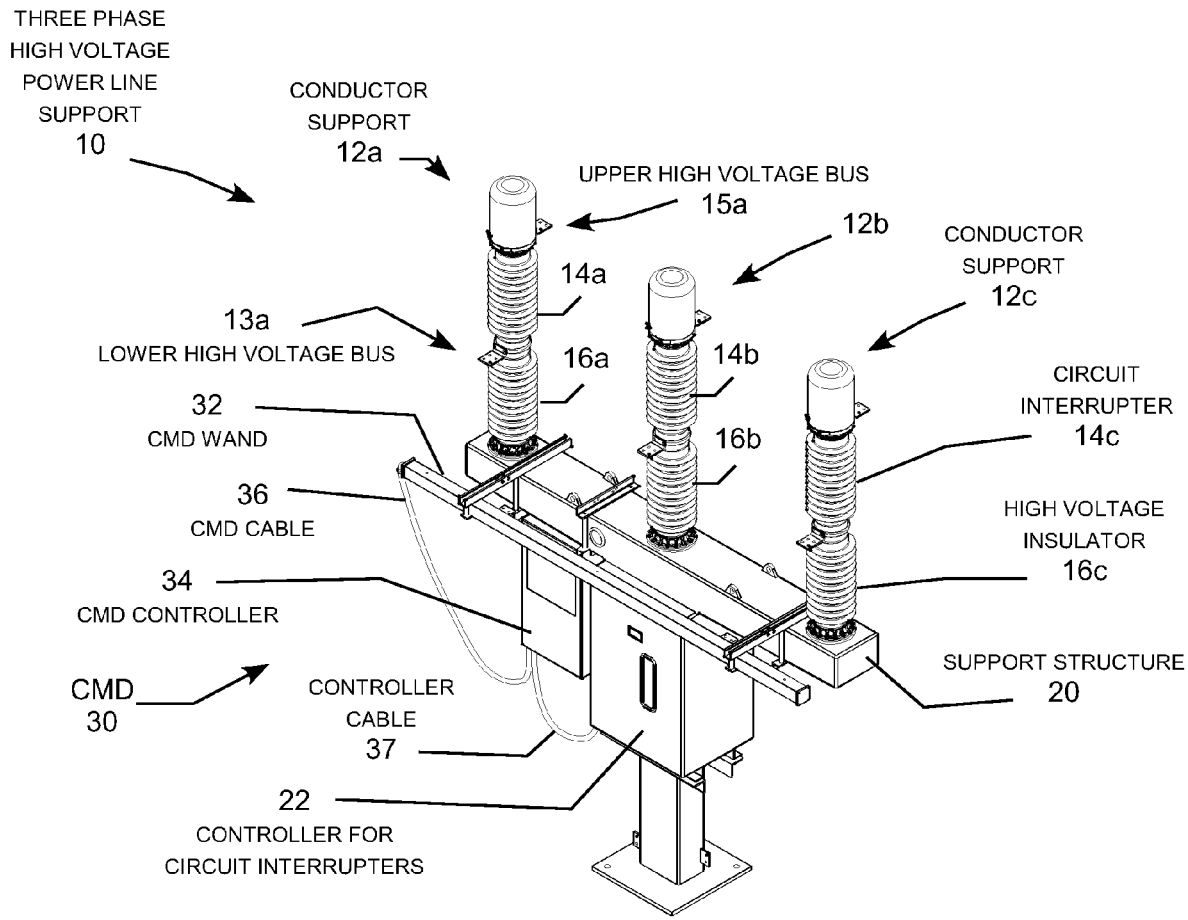
FIG. 1 is a perspective view of a high-voltage power line support with an associated electric current monitoring and response system.

The present invention provides significant improvements in the electric power monitoring and fault protection equipment for multi-phase electric power lines described in U.S. Pat. No. 7,191,074, which is incorporated herein by reference. In particular, the improved electric power monitoring and response system includes a current monitoring device ("CMD") in which a set of electromagnetic sensors located within one or more electrically grounded, non-electromagnetic housings. The grounded housings may also contain electronics defining impedance networks for combining the measurements from the sensors into current values. Placing the electromagnetic sensors and electronics within a grounded housing forms a modular unit typically referred to as a "wand" that can be easily attached to a strategically located structure within the electromagnetic field of a high voltage power line. For example, one or more CMD wands can be conveniently attached directly to the support structure for a high voltage power line, such as a transmission line tower, a distribution line pole, or a disconnect switch located in a transmission or distribution substation. Because the outer housing of the wand is electrically conductive and designed to be electrically grounded, it can be conveniently grounded through metal brackets or ground straps at the time of installation.

In a relatively simple configuration, the CMD includes a single wand connected to a local CMD controller. The wand is typically installed adjacent to an electric power line, for example the wand can be mounted directly to a high voltage power line pole, tower, or disconnect switch in a substation. The CMD wand measures the electromagnetic field in the wand location, and the CMD controller implements computations using adjustable calibration parameters to convert or calibrate the electromagnetic field measurements into current values for the associated electric power line. It should be understood that having elongated, tubular wands containing the electromagnetic sensors and electronics boards that implement impedance networks, and a separate local controller, is one particular design option for the CMD. Of course, the grounded housing for the electromagnetic sensors could have any desired shape, including a sphere or square box. In addition, the electronics could be located entirely within the grounded housings that contain the sensors, located entirely within a separate local controller, distributed between these and other components, or located in whole or in part in another enclosure or location. Nevertheless, it should also be appreciated that locating the sensors and impedance networks in elongated, tubular wands suitable for grounding close to the electric power lines, and locating calibration equipment in a more easily accessible local controller, is a convenient and practical configuration for a distribution substation application, but other configuration may be preferred for other applications. CMDs designed for installation on transmission towers and distribution poles, for example, may be more conveniently deployed with all of the CMS equipment located a single housing, including internal radio equipment, and an antenna extending from the housing.

To improve accuracy and configure the CMD for a particular location, the CMD controller is typically calibrated by obtaining known current values for the power line after the wand has been installed. In particular, conventional ring-type current transformers ("CTs") may be temporarily connected to the power line, and the adjustable calibration parameters of the CMD controller are adjusted to calibrate the readings of the CMD to correspond to the measured current values obtained form the CTs. The CTs are then removed and the calibrated CMD is ready for service with the wand in its installed position.

The local CMD controller is functionally connected to some type of response equipment, which may range from a local disconnect switch to a sophisticated centrally-controlled electric power control system including a wide range of equipment, such as displays and reporting systems, sectionalizing switches, circuit interrupting devices, voltage regulators, voltage sag supporters, capacitor banks, communication equipment, transmission or distribution interconnect switches, generation stations, and so forth. Because the CMD represents an inexpensive current monitoring option that can be easily installed in a wide variety of locations, a robust system of CMDs distributed throughout an electric power system can be used to monitor line currents and other values (it should be noted here that variations of the current monitoring CMD can be used to monitor line voltages and physical sag, as described in U.S. Pat. No. 7,191,074) throughout the electric power system, providing a high level of real-time awareness of the system's operating conditions.

Greater real-time awareness of system-wide operating conditions leads directly to greater abilities to respond effectively to a wide range of system disturbances, such as equipment failure from lightening strikes, large load switching, line faults, overloading, voltage sag, power line sag, power factor degradation, and so forth. This, in turn, allows more effective control of the electric power system using the full range of resources available, from central control of transmission line interconnection points and central station generation plants, to local control of circuit interrupters and sectionalizing switches, and everything in between including voltage regulators, capacitor banks, micro-generation facilities, interruptable loads, load shedding, and so forth. As a result, a fully deployed system of CMDs represent an integral part of the monitoring and control system for an electric power system that significantly improves system safety, efficiency, and reliability.

In particular, a robust system of CMDs deployed in strategic locations throughout an electric power system provides a technically and economically feasible way to obtain real-time knowledge of electric power operating conditions throughout the system and, as a result, provides the ability to respond quickly, effectively, and in many cases automatically to system disturbances from relatively minor to potentially severe. The CMDs further allow system operators to monitor changes in system operating conditions in real time as they implement response actions to potentially serious or dangerous system conditions. It should therefore be appreciated that a robust system of CMDs and response equipment provides an effective way to detect and respond to electric power system disturbances before they multiply and become unstable, resulting in the types of cascading faults that have plagued the U.S. electric grid with major blackouts in recent years.

The particular CMD shown in the figures and described below has a number of important attributes. Although the basic devices shown in the figures include only one or two wands connected to a local controller, any number of wands may be connected to any number of controllers to improve accuracy and system control. For example, multiple wand stations, each having multiple wands positioned in different orientations and elevations, may be deployed in strategic locations in a multi-line substation. Once calibrated, a multi-wand CMD with a sufficient number of properly distributed electromagnetic sensors can be used to monitor all of the line currents in a complex substation with sufficient accurately to automatically operate disconnect switches, circuit breakers and other fault response equipment within the substation. Local substation communication and control equipment (typically referred to as SCADA) can also be used to send the current monitoring information for all of the substations in an electric power system to a central control station, where the entire system can be monitored and controlled in an integrated manner. CMDs can also be installed on distribution line poles and transmission line towers along many or perhaps all of the significant transmission and distribution lines in the power system to monitor line conditions throughout the electric power grid. Communication equipment in the power line CMDs can be used to send the current monitoring information for the power lines to the central control station, for an improved degree of system monitoring and control.

It should be appreciated that the level of electric system monitoring described above would be extremely expensive with conventional electric power monitoring equipment. Perhaps more importantly, this level of monitoring would be technically problematic because each conventional electric system monitoring station rely on current and voltage sensors at line voltage and, and a result, each sensor presents a potential source of electric system fault. That is, one would not install hundreds or thousands of conventional CT current sensors on every power line support in every substation, and on power line poles and towers on every power line throughout the electric power system, because each CT could malfunction, for example as a result of a lightening strike, and itself cause an electric fault. With conventional current and voltage monitoring technology, in other words, the benefit of greater system knowledge is offset by the detriment of increasing the number of potential fault locations in the system. The CMD wands of the present invention, on the other hand, cannot cause electric faults because they are electrically grounded. Hundreds, or even thousands, of these devices can be deployed throughout the electric power grid without increasing the number of potential electric fault locations. This difference is an important distinction separating the CMD of the present invention from conventional CTs, opening a new category of inexpensive, electrically grounded current monitoring devices for high voltage electric power lines.

As another important attribute of the CMD, the frequency response of the CMD wand can be adjusted by placing a thin elongated tuning slot in the outer, grounded housing. Because the grounded housing is formed from a non-electromagnetic, electrically conductive material, such as aluminum or stainless steel, it serves as an electrostatic shield regardless of whether it has a slot. But the frequency response of the wand as an electromagnetic shield can be adjusted by placing a tuning slot along the housing. With no slot, the housing typically shields high frequency electromagnetic signals down to less than the thousand Hertz range. Placing a tuning slot in the casing, however, allows high frequency electromagnetic signals to enter the wand, where they are picked up by the internal electromagnetic sensors. This is because higher frequency signals can pass through the narrow slot, and increasing the width of the slot increases the pass frequency of the slot, allowing higher frequencies to enter the wand. Thus, the width of the tuning slot can be selected to impart a desired frequency pass response to the wand. As a practical matter, the electric power engineer is typically interested in measuring the harmonic content of the electric power flowing on the monitored power line up to about the 15th to 30th harmonic. This application calls for a sufficient wide slot to allow the desired harmonic content up to several thousand Hertz range to pass through the shield.

It should also be noted that the accuracy of the CMD can be improved by using a single wire to form multiple coils along the wand, in which the winding direction and number of turns in the coils vary among the coils. Advantageously, the CMD wand can be implemented with entirely passive electromagnetic sensors (e.g., wire coils) and electronics (e.g., impedance networks) that operate entirely from power induced from the electromagnetic field of the monitored electric power line. In theory, the CMD controller could also be implemented with entirely passive components, although there are significant advantages to separately powering the CMD controller, such as allowing communication equipment in the CMD controller to operate regardless of whether the monitored power line is energized. The skilled electric power engineer will appreciate that many variations of the basic CMD may be implemented once the underling principles are understood. The following description of specific embodiments, with reference to the figures, will help to further illustrate those underling principles in the context of specific embodiments for practicing the invention.

Figure 2:
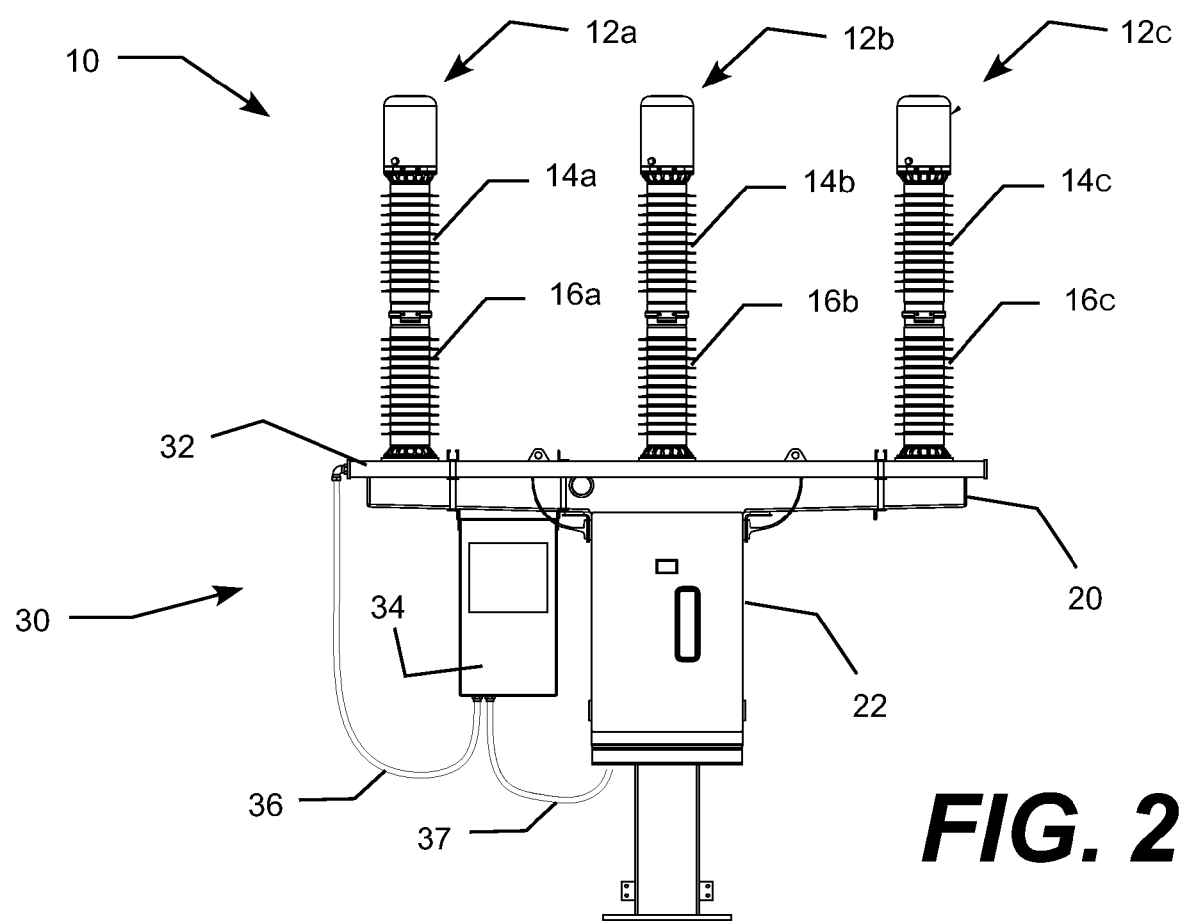
FIG. 2 is a front view of the a high-voltage power line support and an associated electric current monitoring and response system of FIG. 1.

Turning now to the figures, in which the same numerals refer to similar elements throughout the figures, FIG. 1 is a perspective view and FIG. 2 is a front view of a high-voltage power line support 10 with an associated electric current monitoring device ("CMD") system 30. This particular high-voltage power line support is a circuit interrupter (also called a disconnect switch) typically found in an electric power distribution substation. However, the same type of CMD can be installed on a higher voltage transmission line in connection with an associated circuit breaker, on a transmission line tower, on a distribution line pole, and in many other strategic locations in an electric power system. Nevertheless, the CMD 30 shown in FIGS. 1 and 2 is a relatively simple and highly desirable example of the invention because electric power distribution lines are very numerous and vulnerable to a wide range of line faults and disturbances from lightening, tree limbs, animals, motor switching, and so forth.

This particular high-voltage power line support 10 is designed for a three-phase power line, and therefore includes three similar conductor supports 12*a-c*. The high-voltage power line support 10 includes an insulator support for a three-phase power line and a circuit interrupter or disconnect switch for the power line. Referring to the conductor support 12*a*, it includes a lower high voltage bus 13*a* and an upper high lower high voltage bus 15*a* separated by a circuit interrupter 14*a*. An insulator 16*a* separates the lower high voltage bus 15*a* from a support structure 20, which is electrically grounded and physically supports the associated power line. The three conductor supports 12*a-c* are arranged in a line on top of the support structure 20. A controller 22 located under the support structure 20 operates the circuit interrupters 14*a-c*. Examples of suitable circuit interrupters are described in U.S. Pat. Nos. 7,078,643 and 6,236,010, which are incorporated herein by reference. Generally described, the circuit interrupter includes a penetrating contactor located within a hollow insulator that is filled with a dielectric gas, typically $SF_6$. The exterior of the insulators are the visible portions of the circuit interrupters 14*a-c* shown in FIGS. 1 and 2. The penetrating contactors are operated by a toggle mechanisms located within the caps located on top of the conductor supports 12*a-c*, and the controller 22 operates a motor that actuates a push rod that triggers the toggle mechanisms to open and close the penetrating contactors, which are typically operated together.

The CMD 30 includes a wand 32 and a CMD cable 36 connecting the wand to a CMD controller 34. The CMD wand 32 is typically electrically grounded and physically connected to the support structure 20 by one or more metal brackets. The outer housing of the wand is made from a non-electromagnetic, electrically conductive material, such as aluminum or stainless steel. A controller cable 37 connects the CMD controller 34 to the controller 22 for the circuit interrupter. The allows the circuit interrupters 14*a-c* to be operated in response to the measurements obtained by the CMD 30 of the currents flowing in the conductors of the three-phase electric power line supported by the high-voltage power line support 10. The CMD controller 34 may also include (internal or external to the box indicated as the CMD controller) communication equipment, such as SCADA equipment, transmitting the current measurements to a remote controller and associated remote motoring and response equipment. As a result, the remote motoring and response equipment may include a wide variety of local and remotely located electric power system resources, such as circuit breakers, voltage regulators, capacitor banks, voltage sag supporters, sectionalizing switches, interconnect switches, generating stations, central displays, reporting and analysis systems, and so forth.

Figure 3:
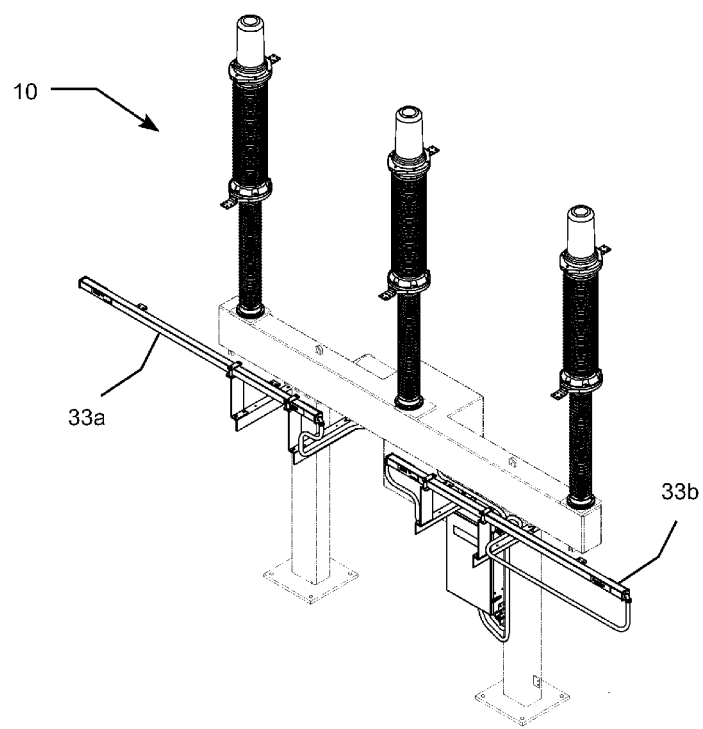
FIG. 3 is a perspective view of an alternative electric power monitoring and response system with two current monitoring wands in separate grounded housings.
Figure 4:
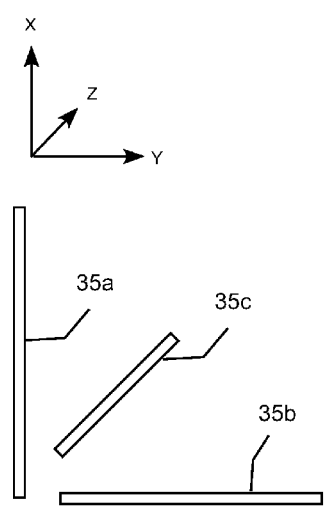
FIG. 4 is a conceptual illustration of a current monitoring device with three wand located on orthogonal axes.

FIG. 3 shows an alternative CMD configuration, in which the single CMD wand 32 shown in FIGS. 1 and 2 has been replaced by a pair of wands 33*a-b* in separate grounded housings. In this particular embodiment, the wands 33*a-b* are collinear, but that need not be the case. To improve accuracy, for example, the CMD may include multiple wands installed in different orientations and elevations. This is illustrated conceptually in FIG. 4, which shows three wands 35*a-c* located along orthogonal axes. In an alternative embodiment, for example, several CMD wand stands with multiple wands in different orientations could be located in strategic positions in a complex substation to simultaneously measure the line currents in multiple transmission and distribution lines. If the CMD wands are not directly supported by a grounded structure, a ground strap can be used to connect the wands to the substation ground grid, a nearby grounded structure, or a ground rod installed for the CMD wand.

Figure 5:
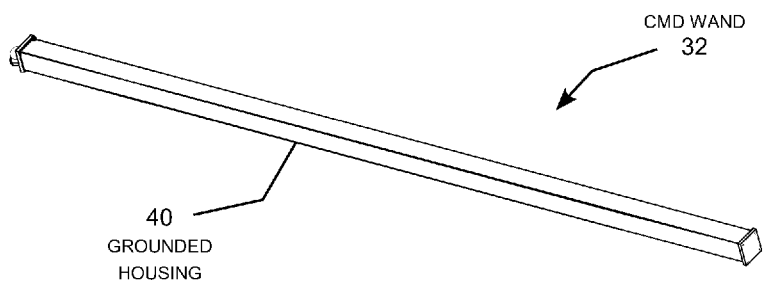
FIG. 5 is a perspective view of a current monitoring device wand for an electric current monitoring and response system.
Figure 6:
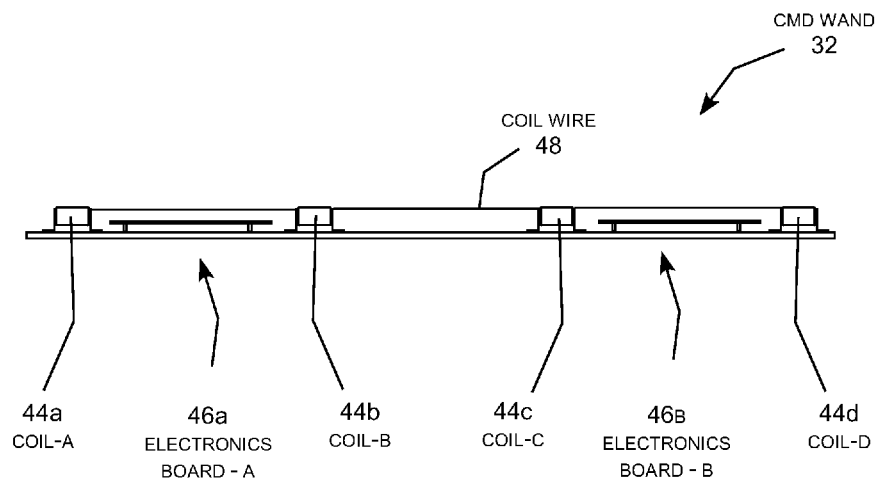
FIG. 6 is a front view of the wand of FIG. 5 with the housing removed to reveal the interior components.
Figure 7:
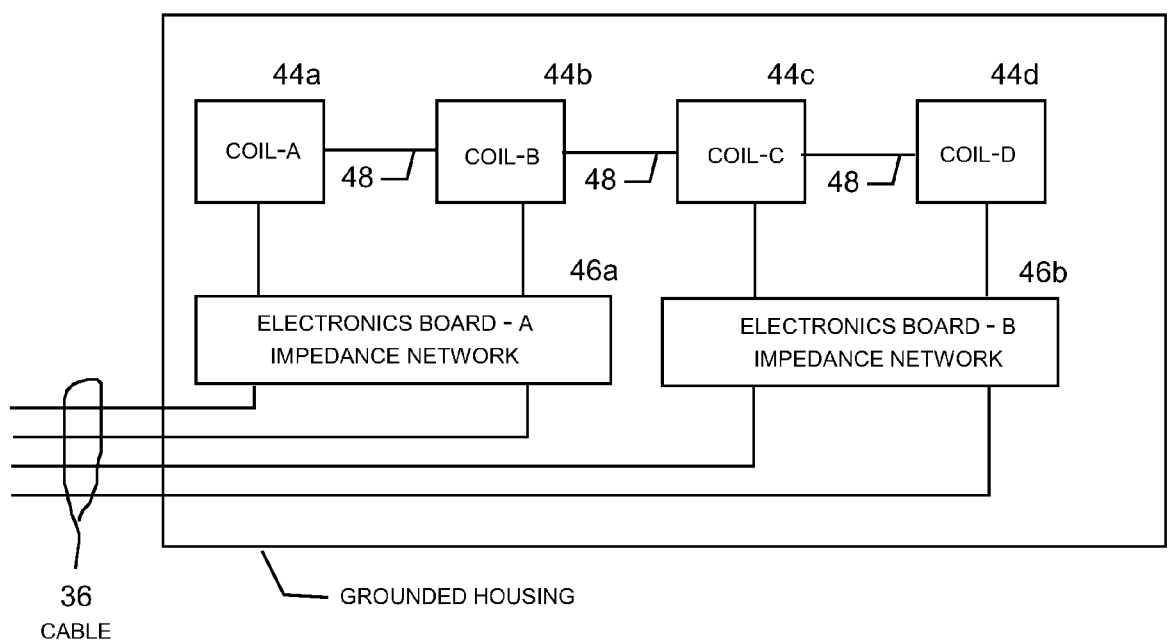
FIG. 7 is an schematic illustration of the wand of FIG. 5.

FIG. 5 is a perspective view of the CMD wand 32, which can include any suitable type of electrically conductive, non-electromagnetic tube that serves as a grounded housing or container 40. In this case, the housing is shown as a tube with a square crosssection, which is amenable to having a flat base supporting the internal coils and circuit boards. However, the tube could also be a round pipe or any other suitable structure. The sensors and electronics may be located on a removable plate, and the tube may include a hinged side, doors or windows, as desired, to allow access to the internal components. FIG. 6 shows the CMD wand with the housing 40 removed to reveal the internal components, which in this simple example includes four wire coils 44*a-d* and two electronics boards 46*a-b*. FIG. 7 is an schematic illustration of this particular CMD wand 32. In this example, the first electronics board 46*a* implements impedance networks for the coils 44*a-b*, and the second electronics board 46*b* implements impedance networks for the coils 44*c-d*. The coils 44*a-d* may be wound from a single wire 48, and the four coils may have different numbers of turns, with some coils winding clockwise and others winding counterclockwise.

Figure 8:
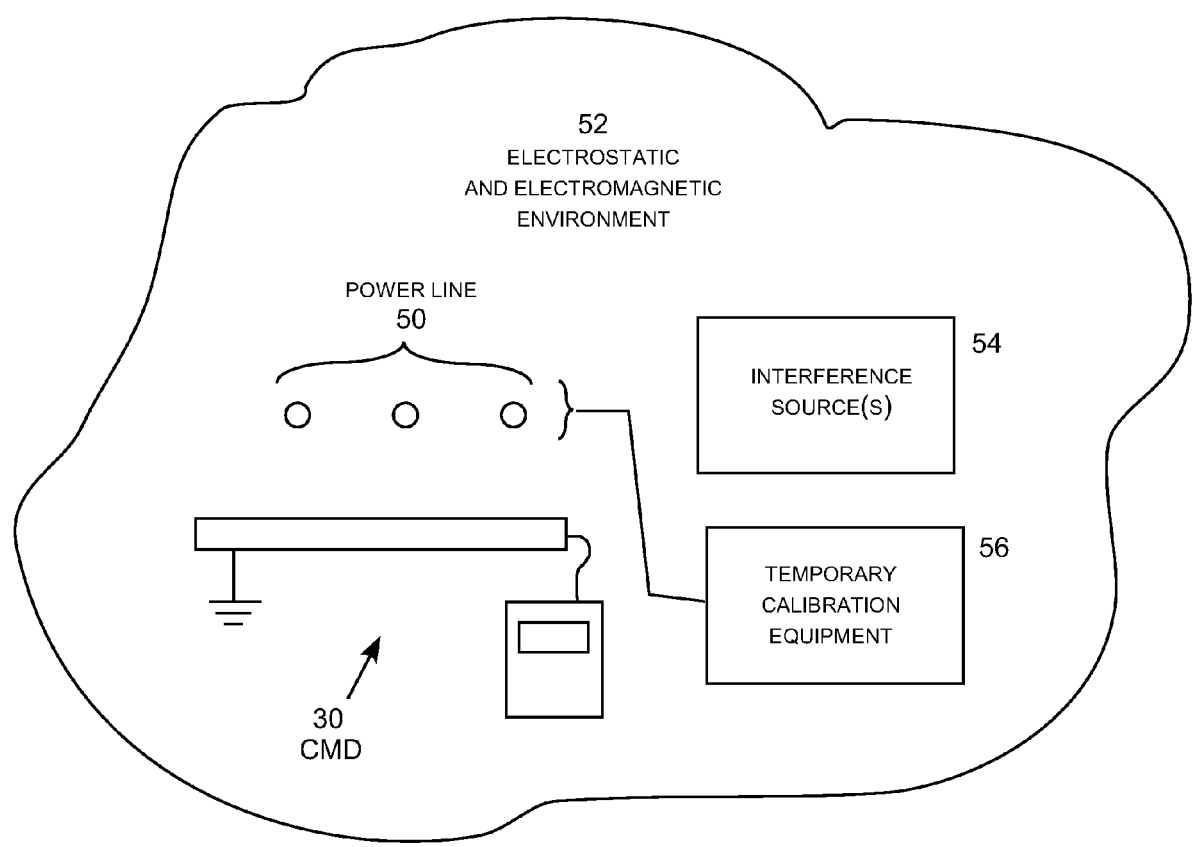
FIG. 8 is a conceptual illustration of a calibrated electric current monitoring and response system.

FIG. 8 is a conceptual illustration for calibration of the CMD 30, which may be installed in a potentially complex electrostatic and electromagnetic environment 52, such as an electric power substation with multiple electric power lines at different voltages located at different elevations extending in different directions. The electromagnetic environment may also include one or more sources of electromagnetic and electrostatic interference 54. For example, any large metal structure, such as a transformer or oil tank, would present source of electrostatic interference, which could potentially be non-linear as experienced at the CMD wand. The interference source might also be electromagnetic, in which case it could also present a source of electromagnetic interference, again potentially nonlinear. Even in the absence of the sources of interference, an electrostatic and electromagnetic environment involving multiple power lines at multiple orientations and voltages can be extremely complex to model mathematically based on theoretical calculations. For these reasons, it is practically effective to calibrate the CMD 30 by installing temporary calibration equipment 56, such as conventional current transformers (CTs), to obtain known values for the currents flowing on the various power line conductors, as represented by the power line 50 shown in FIG. 8. Adjustable parameters of the CMD controller, such as weighting factors, are then adjusted to match the currents computed by the CMD to the currents measured by the temporary calibration equipment 56. The temporary equipment is then removed, and the CMD is calibrated and ready to measure the currents flowing in the power line 50.

Figure 9:
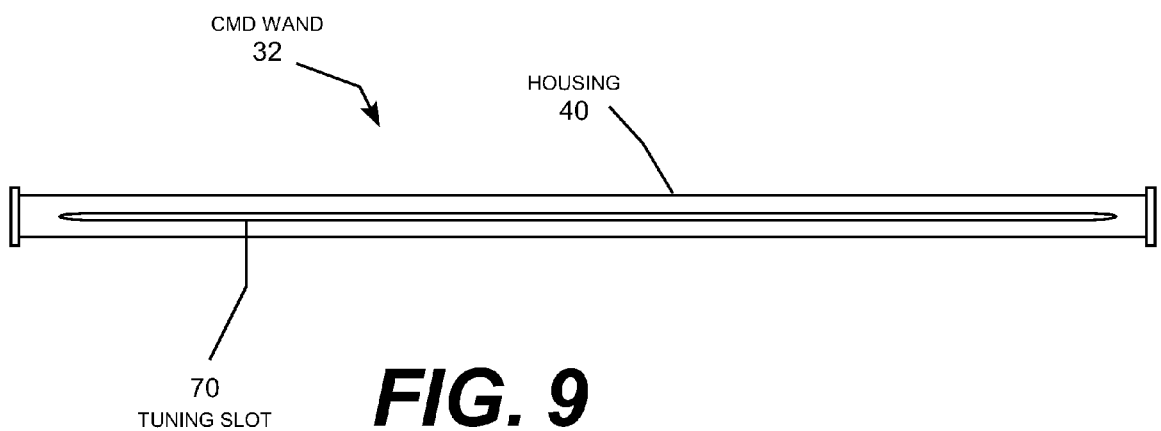
FIG. 9 is a front view of an alternative wand for an electric current monitoring and response system that includes a tuning slot.
Figure 10:
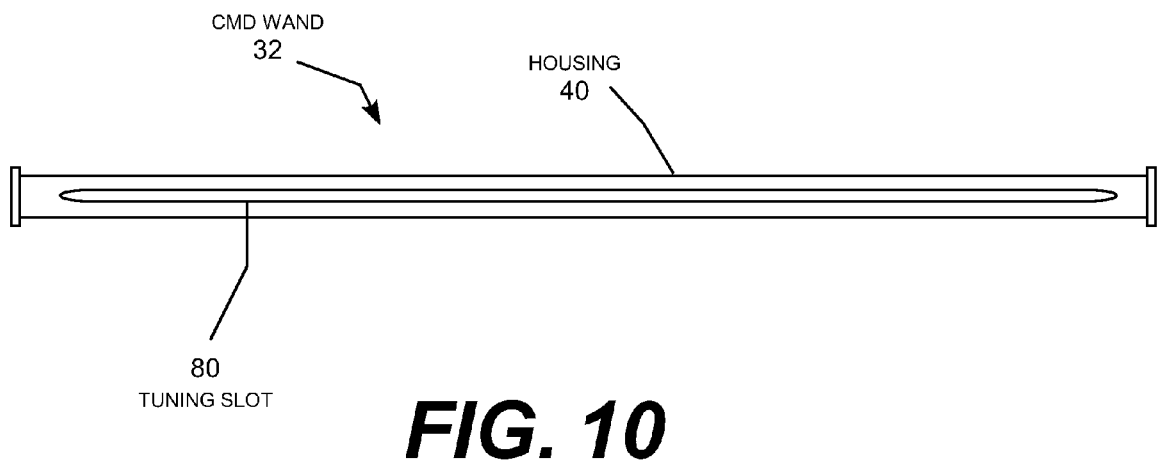
FIG. 10 is a front view of another wand for an electric current monitoring and response system that includes a tuning slot with a different width.

FIG. 9 is a front view of the wand 32 for an electric current monitoring and response system that includes a tuning slot 70 in the grounded housing 40. FIG. 10 shows the wand with a housing having a slightly wider tuning slot 80. The tuning slot adjusts the frequency response of the wand, as described preciously. Generally, a housing with no slot shields high frequency electromagnetic components down below the thousand Hertz range. The tuning slot allows higher frequency electromagnetic components to enter the housing, where they can be registered by the internal coils. Generally, the frequencies passed by the slot are controlled by the width of the slot, with a wider slot allowing higher frequencies to pass into the housing. In practice, the electric power engineer is usually interested in measuring the harmonic content of the currents on the power line up to about the 15th to the 30th harmonic (i.e., 900 to 1,800 Hz), and frequencies above about the 10th to 15th harmonic (i.e., 600 to 900 Hz) may be shielded by a wand housing with no tuning slot. Therefore, the tuning slot should be sufficiently wide to allow the desired harmonic content to be measured by the wand.

Figure 11:
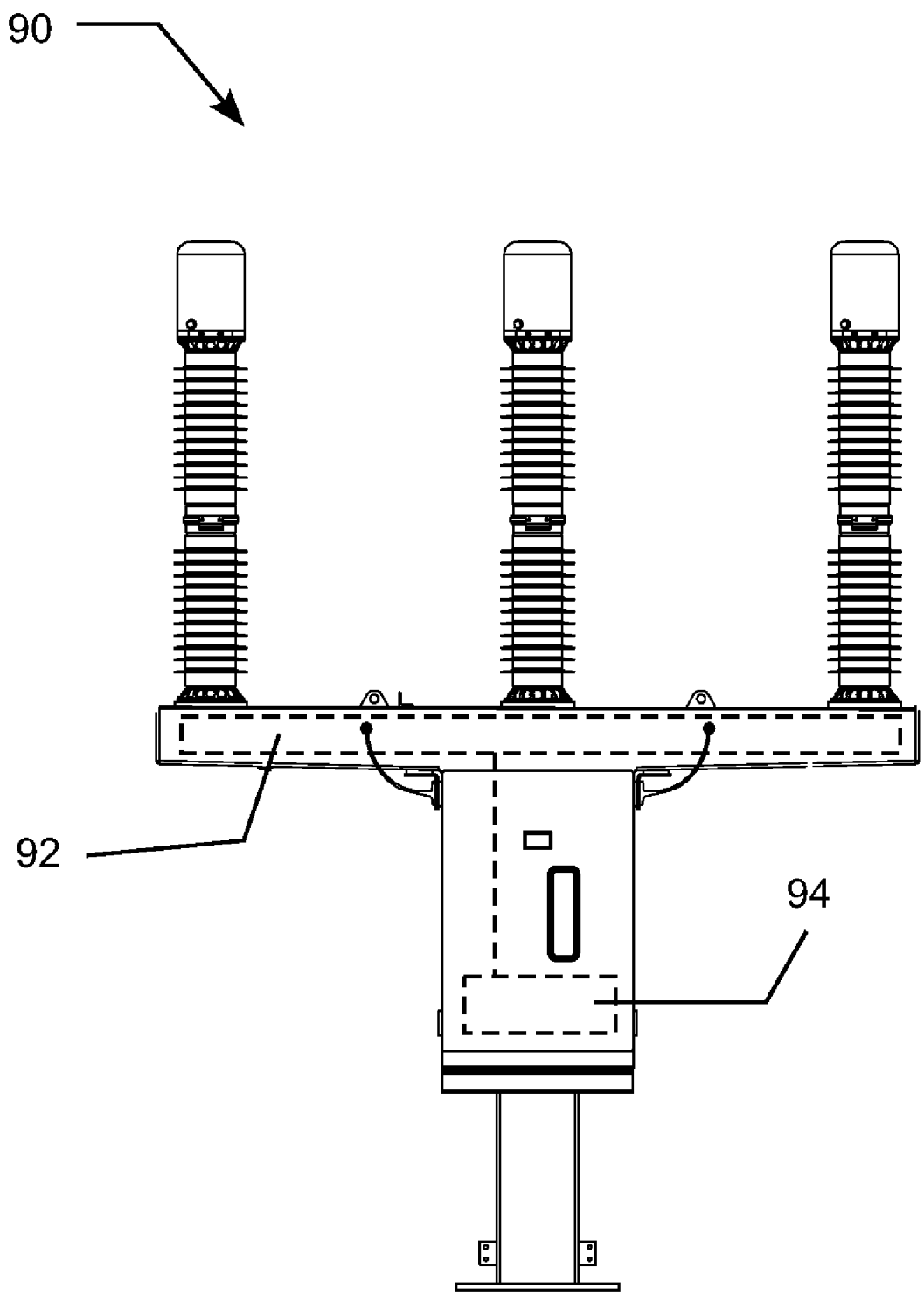
FIG. 11 is a front view of a high-voltage power line support with an internal electric current monitoring and response system.

FIG. 11 is a front view of a high-voltage power line support 90 with an internal electric current monitoring and response system including a CMD wand 92 and a CMD controller 94 located inside the power line support itself. This is a convenient configuration for new power line supports, whereas the external CMD shown in FIG. 1 can be readily installed on existing power line supports.

Figure 12:
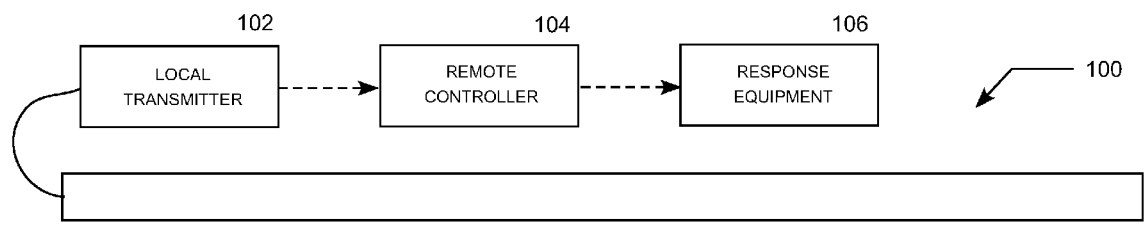
FIG. 12 is a side view of an alternative electric current monitoring and response system that includes a local transmitter, remote controller and remote response equipment.
Figure 13:
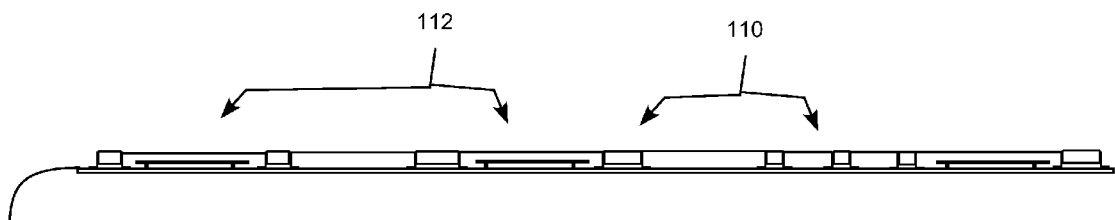
FIG. 13 is a side view of a wand for an alternative current monitoring and response system with the housing removed to reveal the interior components.

Another alternative is illustrated in FIG. 12 by the CMD 100, which includes a local transmitter 102, remote controller 104, and remote response equipment 106. As discussed previously, this configuration allows CMDs throughout an electric power system to be integrated for a wide range of electric power monitoring and response activities, for example from a central control station. FIG. 13 conceptually illustrates multiple coils 110 and multiple electronics board 112 within the CMD wand 100. In general, varying the size, spacing, number of coils, and winding directions among the coils can improve the accuracy of the CMD.

Figure 14:
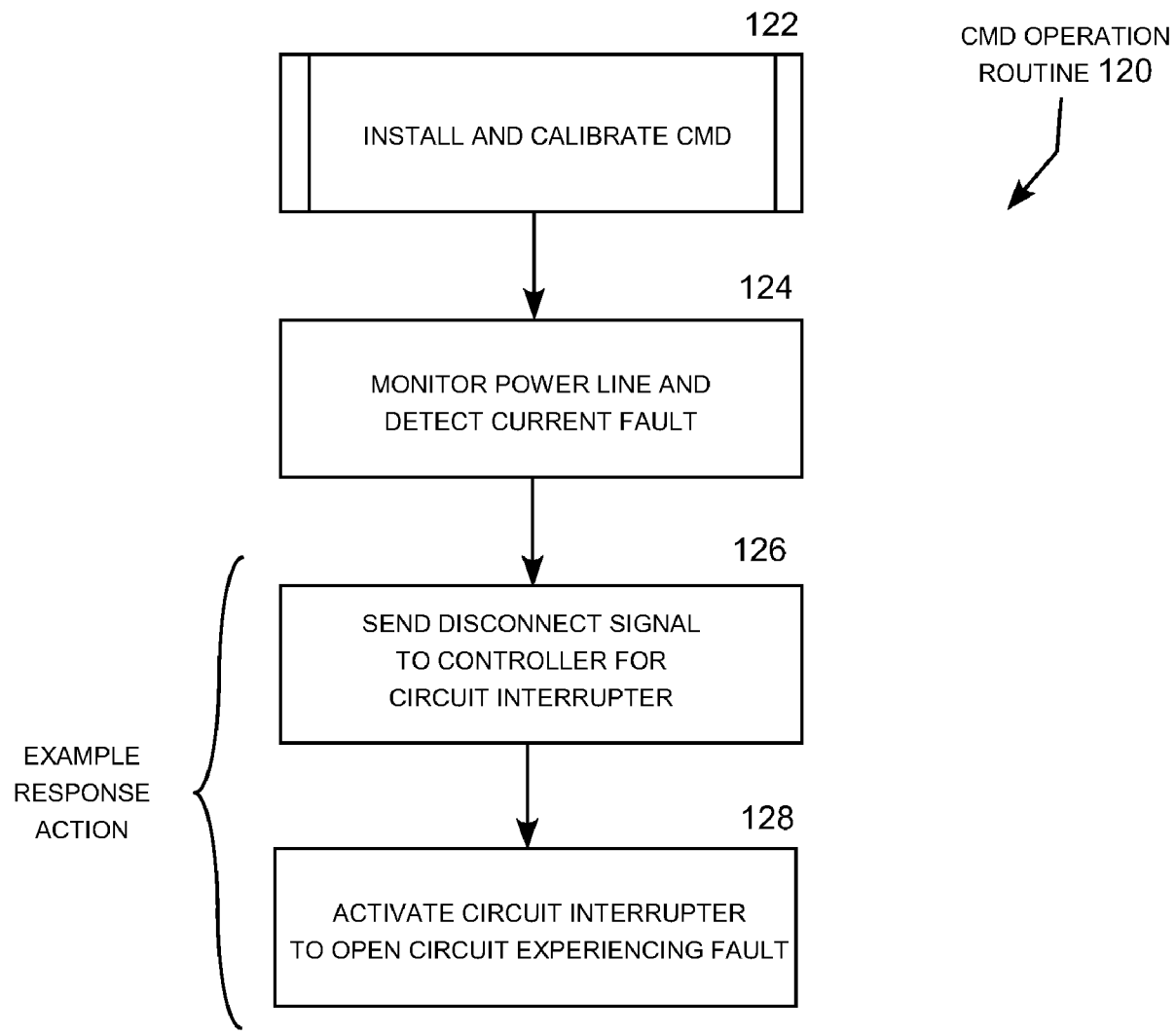
FIG. 14 is a logic flow diagram illustrating the operation of an electric current monitoring and response system.

FIG. 14 is a logic flow diagram illustrating a routine 120 for calibrating and operating the CMD 30 shown in FIG. 1. In routine 122 (shown in greater detail in FIG. 15), the CMD is installed and calibrated, in this example within the electromagnetic field of an associated electric power line connected to the power line support 10. Step 122 is followed by step 124, in which the CMD monitors the associated electric power line and detects a current fault on the power line. As an example response action that a CMD can implement, step 124 is followed by step 126, in which the CMD 30 sends a disconnect signals to the controller 22 for the circuit interrupter. Step 126 is followed by step 128, in which the controller 22 activates the circuit interrupters 14a-c to open the associated electric power lines.

Figure 15:
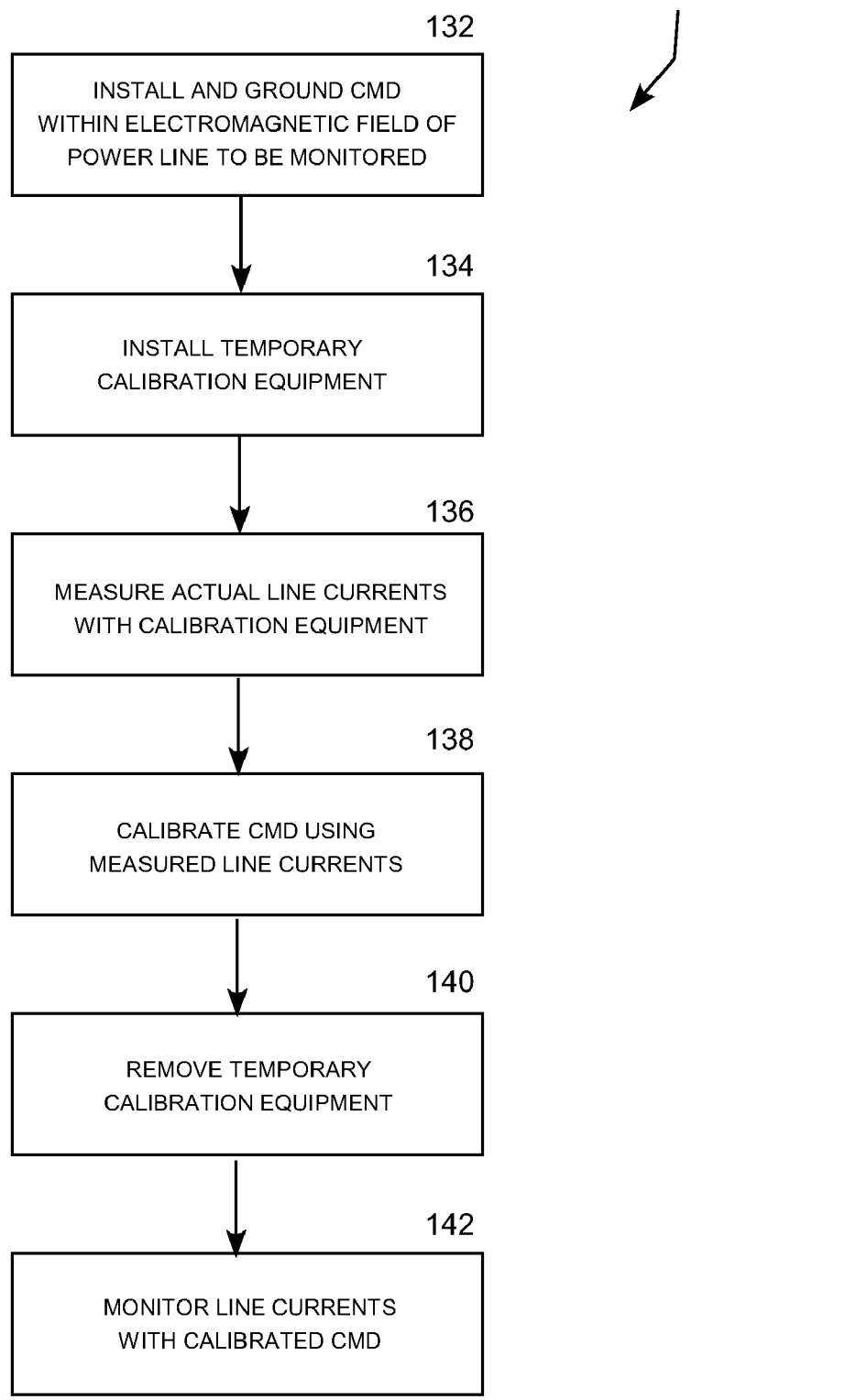
FIG. 15 is a logic flow diagram illustrating a routine for calibrating an electric current monitoring and response system.

FIG. 15 is a logic flow diagram illustrating routine 122 for calibrating the CMD 30. In step 132, the CMD wand 32 is installed and electrically grounded within the electromagnetic field of the associated electric power line, as shown in FIG. 1. The CMD controller 34 is also installed and the necessary cables 36, 37 are connected. Step 132 is followed by step 134, in which temporary calibration equipment is installed. In particular, conventional CTs can be temporarily installed to measure the currents flowing on the phase conductors of the monitored power line. Step 134 is followed by step 136, in which the calibration equipment is used to obtain known measurements for the line currents. Step 136 is followed by step 138, in which adjustable calibration parameters of the CMD are adjusted to match the line currents computed by the CMD to the known current values. Specifically, each line current is typically computed as a weighted sum of the sensor values received from the various electromagnetic sensors. The weighting factors applied to signals received from various electromagnetic sensors are typically adjusted until the CMD computed all of the line currents correctly. Different current levels with different conductors energized can be tested to ensure that the CMD works acceptably for a reasonable range of current values that it is likely to encounter. Step 138 is followed by step 140, in which the temporary calibration equipment is removed, and in step 142 the calibrated CMD is used to monitor the power line.

It should be understood that the foregoing relates only to the exemplary embodiments of the present invention, and that numerous changes may be made therein without departing from the spirit and scope of the invention as defined by the following claims.

The invention claimed is:

1. An electric current monitoring and response system for high voltage electric power lines, comprising:
   one or more electrically conductive, non-electromagnetic housings configured to be electrically grounded in a position within electromagnetic fields created by phase conductors of one or more multi-phase, high-voltage electric power lines;
   a set of electromagnetic field sensors laterally distributed within the housings configured to simultaneously measure a combined electromagnetic fields generated by the phase conductors;
   for each of a plurality of electric current values for the phase conductors, electronics defining an impedance network operative for combining the measurements received from the electromagnetic field sensors to create an output signal indicative of the associated electric current value, wherein the electromagnetic field sensors and electronic defining the impedance network consist of passive components that do not require an electric power source other than the electromagnetic fields generated by the phase conductors; and
   response equipment operative to implement a response action based on the electric current values.

2. The system of claim 1, wherein the electronics defining the impedance networks are located with in the housings.

3. The system of claim 1, wherein the housings are configured to be connected to, physically supported by, and electrically grounded to a support structure that supports high voltage insulators that support the phase conductors.

4. The system of claim 3, wherein the support structure is located within a transmission or distribution substation.

5. The system of claim 1, further comprising a controller implementing adjustable parameters for calibrating the electric current values.

6. The system of claim 1, wherein:
   the response equipment comprises a local circuit interrupter for opening a high-voltage electric circuit comprising one of the phase conductors; and
   the controller is configured to trigger operation of the circuit interrupter in response to determining that an electric fault has occurred in the electric circuit comprising the phase conductor based on an associated electric currents value.

7. The system of claim 1, wherein the response equipment comprises a local transmitter, a remote controller, and remote response equipment in a location remote from the housings containing the electromagnetic field sensors.

8. The system of claim 7, wherein the remote response equipment is selected from the group consisting of a display, a circuit interrupting device, a voltage regulator, a voltage sag supporter, a capacitor bank, communication equipment, and reporting system.

9. The system of claim 1, wherein each housing comprises an elongated slot configured to impart a desired frequency response to the electromagnetic field sensors.

10. The system of claim 1, wherein the electromagnetic field sensors are formed from a continuous electrical wire and the coil lengths and coil winding directions differ among the coils.

11. A method for obtaining electric current values for a multi-phase, high-voltage electric power line, comprising:
   installing an electric current monitoring system within electromagnetic fields created by phase conductors of one or more multi-phase, high-voltage electric power lines, wherein the electric current monitoring system comprises a set of electromagnetic field sensors laterally distributed within one or more electrically conductive, non-electromagnetic, electrically grounded housings and, for each electric current value, electronics defining an impedance network operative for combining a measurements received from the electromagnetic field sensors to create an output signal indicative of the associated electric current value;
   applying known electric currents to the phase conductors;
   obtaining output values representing computed electric current values from the electric current monitoring system;
   calibrating parameters of the electric current monitoring system to conform the computed electric current values to the known electric currents;
   discontinuing the application of known electric currents to the phase conductor;
   applying unknown electric currents to the phase conductors; and
   using the calibrated electric current monitoring system to compute electric current values for the unknown electric current values.

12. The method of claim 11, further comprising the steps of:
   determining that an electric fault has occurred affecting the current flowing in one of the phase conductors based on the computed electric current values; and
   implementing a local response action.

13. The method of claim 12, wherein the local response action comprises opening a circuit interrupter associated with the affected phase conductor.

14. The method of claim 11, further comprising the steps of:

transmitting the computed electric current values to a remote location; and implementing a remote response action at the remote location based on the computed electric current values.

15. The method of claim 14, wherein the remote response action is selected from the grout consisting of displaying the computed electric current values, operating a circuit interrupting device, operating a voltage regulator, operating a voltage sag supporter, operating a capacitor bank, and communicating a report comprising the computed electric current values.

16. The method of claim 11, further comprising the step of configuring each housing with an elongated slot configured to impart a desired frequency response to the electromagnetic field sensors.

17. The method of claim 11, further comprising the step of forming the electromagnetic field sensors from a continuous electrical wire wherein the coil lengths and coil winding directions differ among the coils.

18. The method of claim 11, further comprising the step of configuring the electromagnetic field sensors and electronics defining the impedance network from passive components that do not require an electric power source other than the electromagnetic fields generated by the phase conductors.

19. An electric power system comprising:

a plurality of multi-phase, high-voltage electric power lines, each comprising phase conductors;

for each power line, an electric current monitoring system located within electromagnetic fields created by the phase conductors comprises a set of electromagnetic field sensors laterally distributed within one or more electrically conductive, non-electromagnetic, electrically grounded housings and, for each electric current value, electronics defining an impedance network operative for combining a measurements received from the electromagnetic field sensors to create an output signal indicative of a associated electric current value, wherein the electromagnetic field sensors and electronic defining the impedance network consist of passive components that do not require an electric power source other than the electromagnetic fields generated by the phase conductors; and response equipment selected from the group consisting of a display, a circuit interrupting device, a voltage regulator, a voltage sag supporter, a capacitor bank, communication equipment, and reporting system operative to respond to the output signals.

* * * * *